US012674231B2

(12) United States Patent
Kurapov et al.

(10) Patent No.: US 12,674,231 B2
(45) Date of Patent: Jul. 7, 2026

(54) AL-RICH AlTiN-BASED FILMS

(71) Applicant: Oerlikon Surface Solutions AG, Pfäffikon, Pfäffikon (CH)

(72) Inventors: Denis Kurapov, Walenstadt (CH); Siva Phani Kumar Yalamanchili, Sargans (CH); Anders Olof Eriksson, Chur (CH)

(73) Assignee: Oerlikon Surface Solutions AG, Pfäffikon, Pfäffikon (CH)

( * ) Notice: Subject to any disclaimer, the term of this patent is extended or adjusted under 35 U.S.C. 154(b) by 259 days.

(21) Appl. No.: 18/476,570

(22) Filed: Sep. 28, 2023

(65) Prior Publication Data

US 2024/0043985 A1     Feb. 8, 2024

Related U.S. Application Data

(62) Division of application No. 16/607,994, filed as application No. PCT/EP2018/073915 on Sep. 5, 2018, now Pat. No. 11,965,234.

(60) Provisional application No. 62/554,213, filed on Sep. 5, 2017.

(51) Int. Cl.
| | |
|---|---|
| *C23C 14/06* | (2006.01) |
| *C23C 14/00* | (2006.01) |
| *C23C 14/34* | (2006.01) |
| *C23C 14/35* | (2006.01) |
| *C23C 14/54* | (2006.01) |

(52) U.S. Cl.
CPC ...... *C23C 14/0641* (2013.01); *C23C 14/0094* (2013.01); *C23C 14/345* (2013.01); *C23C*

*14/3485* (2013.01); *C23C 14/35* (2013.01); *C23C 14/541* (2013.01)

(58) Field of Classification Search
None
See application file for complete search history.

(56) References Cited

U.S. PATENT DOCUMENTS

| | | | |
|---|---|---|---|
| 5,015,493 | A | 5/1991 | Gruen |
| 5,366,564 | A | 11/1994 | Yamagata et al. |
| 2009/0011593 | A1 | 1/2009 | Inomata |
| (Continued) | | | |

FOREIGN PATENT DOCUMENTS

| | | |
|---|---|---|
| JP | H05285215 A | 11/1993 |
| JP | 2015501371 A | 1/2015 |
| (Continued) | | |

OTHER PUBLICATIONS

Endler, I. et al. "Novel Aluminum-Rich Ti(1-x)AlxN Coatings by LPCVD," Surface & Coatings Technology, May 15, 2008, pp. 530-533, vol. 203, Elsevier BV, Amsterdam, NL.
(Continued)

*Primary Examiner* — Seth Dumbris

(57) ABSTRACT

This invention relates to a coating comprising at least one AlTiN-based film deposited by means of a PVD process, wherein the at least one AlTiN-based film deposited is comprising an Al-content—in relation to the Ti-content—in atomic percentage higher than 75%, and wherein the AlTiN-based film exhibits solely a crystallographic cubic phase and internal compressive stresses and this invention relates to a method involving deposition of an AlTiN-based film.

5 Claims, 10 Drawing Sheets

(56) References Cited

U.S. PATENT DOCUMENTS

Figure 1:
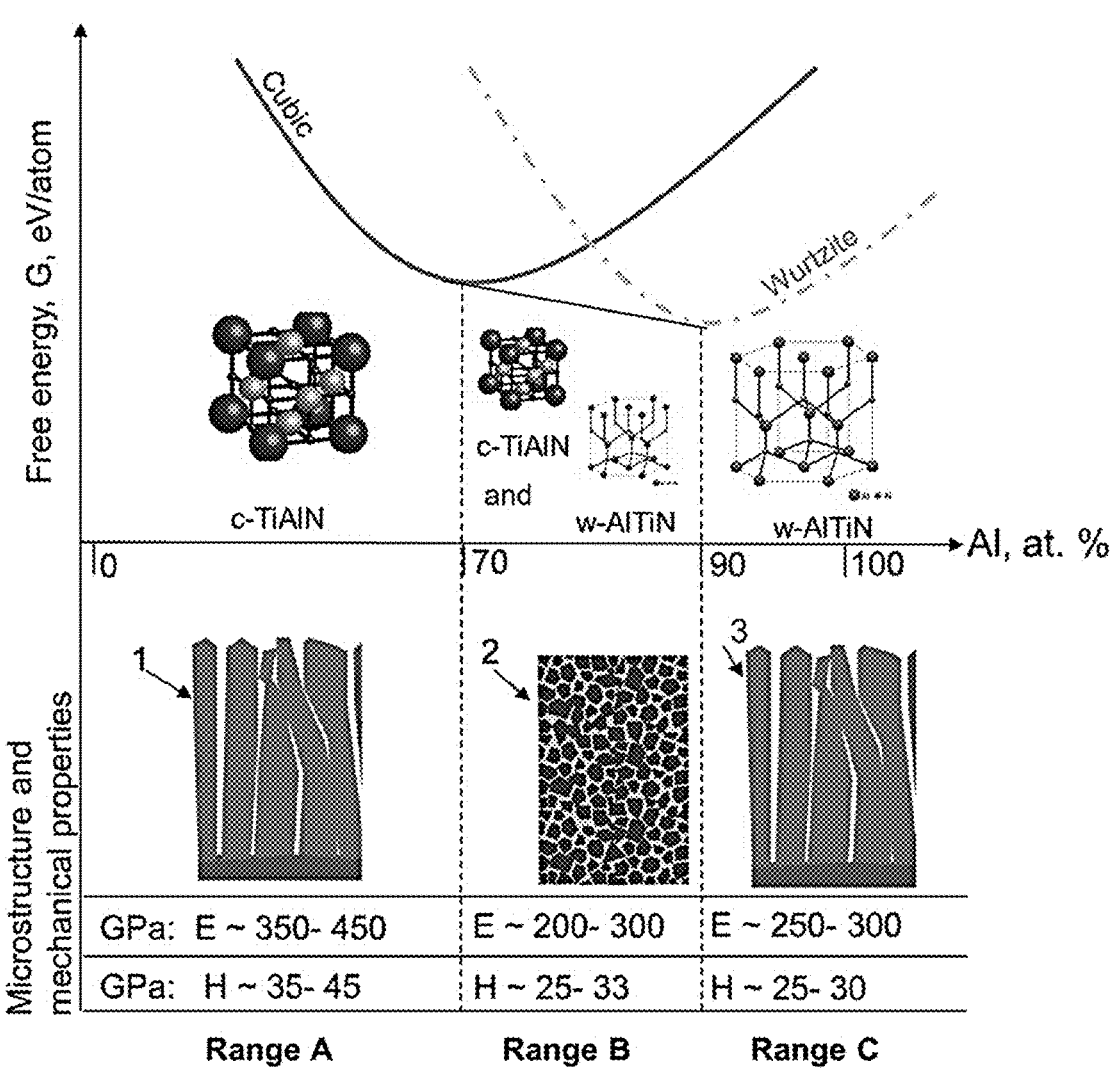

| | | | |
|---|---|---|---|
| 2009/0123779 A1* | 5/2009 | Endler | C23C 28/044 |
| | | | 427/255.391 |
| 2012/0201615 A1* | 8/2012 | Ni | C23C 14/0641 |
| | | | 407/30 |
| 2014/0234616 A1 | 8/2014 | Hultman et al. | |
| 2017/0036274 A1* | 2/2017 | Abe | B23B 51/00 |

FOREIGN PATENT DOCUMENTS

| | | | |
|---|---|---|---|
| WO | 2017110463 A1 | 6/2017 | |
| WO | WO-2019035220 A1 * | 2/2019 | C23C 14/06 |

OTHER PUBLICATIONS

Greczynski, G. et al. "Selection of Metal Ion Irradiation for Controlling Ti(1-x)AlxN Alloy Growth via Hybrid HIPIMS/Magnetron Co-Sputtering," Vacuum, 2012, pp. 1036-1040, vol. 86, Elsevier BV, Amsterdam, NL.
Wu, Wan-Yu, et al. "Effect of DC Input Power and Nitrogen Ratio on the Deposition of Ti(1-x)AlxN Thin Films Using High Power Impulse Magnetron Sputtering Technique," Surface & Coatings Technology, Mar. 18, 2016, pp. 48-53, vol. 303, Elsevier BV, Amsterdam, NL.

* cited by examiner

| Example | Target composition in at. % | Coating composition measured by EDX in at. % | | | | Al/(Al+Ti) in at. % |
|---|---|---|---|---|---|---|
| | | Al | Ti | Ar | N | |
| #1 | Al60Ti40 | 26.7 | 18.5 | 0.5 | 54.84 | 0.59 |
| #2 | Al75Ti25 | 34.98 | 12.48 | 0.3 | 52.55 | 0.74 |
| #3 | Al80Ti20 | 38.47 | 9.44 | 0.4 | 52.1 | 0.80 |

Figure 3 a)

b)

c)

| Example | Optical microscopic image | Coating roughness | |
|---------|---------------------------|:---:|:---:|
| | | Ra [µm] | Rz [µm] |
| #1 | | 0.035 ± 0.01 | 0.90 ± 0.05 |
| #2 | | 0.025 ± 0.05 | 0.70 ± 0.05 |
| #3 | | 0.030 ± 0.05 | 0.80 ± 0.05 |
| #4 | | 0.100 ± 0.05 | 2.30 ± 0.05 |

Figure 6

AL-RICH AlTiN-BASED FILMS

The present invention relates to coatings comprising at least one AlTiN-based film produced by means of a PVD process, wherein the AlTiN-based film is deposited comprising an Al-content in relation to the Ti-content in atomic percentage higher than 67%, and wherein the AlTiN-based film is formed exhibiting crystallographic cubic phase and internal compressive stresses. The present invention relates furthermore to a method for producing such inventive coatings.

BACKGROUND OF THE INVENTION

AlTiN based thin films are well known as protecting coatings for attaining better wear resistance in cutting and forming operations and other related applications. It is known that AlTiN coatings form a metastable solid-solution in a cubic phase, when the aluminium content in relation to the titanium content is up to 67 in atomic percentage. It means 67 at. % Al in the metallic sub-lattice. These kind of coatings exhibits usually columnar structure, Young's modulus between 380 GPa and 450 GPa and hardness between 35 GPa and 40 GPa in the as-deposited state.

Beyond 67 at. % of aluminium, a nanocomposite structure of c-TiN and w-AlN rich domains prevail. Precipitation of w-AlN causes a considerable reduction in elastic modulus, and hardness that leads to a lower wear resistance. This is well-studied and is graphically represented in FIG. 1.

OBJECTIVE OF THE PRESENT INVENTION

An objective of the present invention is to provide a method for producing AlTiN-based coatings, which are coatings consisting of one or more AlTiN-based films or are coatings comprising at least one AlTiN-based film, said at least one AlTiN-based film exhibiting Al content in the metallic sub-lattice of more than 67 at. % (it means considering Al content in at. %+Ti content in at. %=100 at. %), without a considerable reduction in elastic modulus.

Another objective of the present invention is to provide a coating comprising at least one AlTiN-based film comprising an Al-content—in relation to the Ti-content—in atomic percentage higher than 67%, without a considerable reduction in elastic modulus.

DESCRIPTION OF THE PRESENT INVENTION

The objective of the present invention may be attained by using a method for depositing at least one AlTiN-based film on a surface of a substrate to be coated, wherein for producing the AlTiN-based film a physical vapour deposition (PVD) process is used, in which the coating parameters are selected obtaining a reduced mobility of the ad-atoms being involved in the formation of the AlTiN-based film at the substrate surface and resulting in an increment of the metastable solubility of Al in the crystallographic cubic phase of the AlTiN-based film being formed.

Concretely, the present invention relates to a method involving deposition of an AlTiN-based film with chemical composition in atomic percentage corresponding to the formula $(Al_aTi_b)(N_cAr_d)_y$, with $0 \leq d < 0.02$, $1 \leq c > 0.98$, $a+b=1$, $c+d=1$ and $a>0.75$, in particular $0.76 \leq a \leq 0.96$, where a, b, c and d are the atomic fraction of the concentration of aluminum, titanium, nitrogen and argon, respectively, and $0.8 \leq y \leq 1.2$, by means of a PVD process, wherein:

at least one target comprising Al and Ti is used as material source for providing the metallic elements for forming the AlTiN-based film, the at least one target is sputtered in an atmosphere comprising nitrogen gas as reactive gas, preferably by using High Power Pulse Magnetron Sputtering "HiP-IMS" techniques, the Al-content in the at least one target—in relation to the Ti-content—in atomic percentage is of 76% or higher, preferably of 80% or higher, in particular between 76% and 96%, the coating parameters are selected so that the mobility of the atoms being involved in the formation of the AlTiN-based film at the substrate surface is reduced in such a manner that the metastable solubility of Al in the crystallographic cubic phase of the AlTiN-based film is increased, thereby synthesizing said AlTiN-based film that exhibits a crystallographic cubic phase and internal compressive stresses and does not exhibit X-ray peaks corresponding to wurtzite phase of Al—N, preferably the coating parameters involve:

preferably applying a negative bias voltage at the substrate to be coated, wherein the bias voltage value is between −40 V and −200 V, preferably between −120 V and −200 V, preferably maintaining a substrate temperature at a value between 150° C. and 300 C, preferably between 200° C. and 300° C. or more preferably between 200° C. and 250° C., and preferably adjusting a $N_2$ partial pressure at which the sputtering of the target occurs in transition mode.

Preferably the coating parameters involve:

applying a negative bias voltage at the substrate to be coated, wherein the bias voltage value is between −40 V and −200 V, preferably between −120 V and −200 V.

Preferably the coating parameters involve:

maintaining a substrate temperature at a value between 150° C. and 300 C, preferably between 200° C. and 300° C. or more preferably between 200° C. and 250° C.

Preferably the coating parameters involve:

adjusting a $N_2$ partial pressure at which the sputtering of the target occurs in transition mode.

Preferably the N2 partial pressure is in the range between 0.1 Pa and 0.14 Pa, preferably in the range between 0.11 Pa and 0.13 Pa.

Preferably the coating parameter "power density" of the HiPIMS PVD process is selected so, that the HiPIMS PVD process is operated with a high power density up to 3 kW/cm2.

Preferably pulse lengths of up to 100 ms are used.

One of the challenges here is to push the metastability of c-AlTiN to higher Al concentrations, e.g. when Al content in the metallic sub-lattice is above 75 at. %, i.e. when x>0.75, in particular when x≥80 at. %, if the chemical composition of the AlTiN-based film (film means in this context a thin film which can have film thickness in nano-meter range or in micro-meter range) can be represented by the formula: $(Al_xTi_{1-x})N$.

The other objective of the present invention may be attained by a coating comprising at least one AlTiN-based film deposited by means of a PVD process, wherein the at least one AlTiN-based film deposited is comprising an Al-content—in relation to the Ti-content—in atomic percentage higher than 75%, and wherein the AlTiN-based film exhibits solely a crystallographic cubic phase and internal compressive stresses.

Preferably said at least one AlTiN-based film has a chemical composition in atomic percentage corresponding to the formula $(Al_aTi_b)(N_cAr_d)_y$ with $0 \leq d < 0.02$, $1 \geq c > 0.98$, $a+b=1$, $c+d=1$ and $a>0.75$, where a, b, c and d are the atomic fraction of the concentration of aluminum, titanium, nitrogen and argon, respectively, and $0.8 \leq y \leq 1.2$.

Preferably the content of argon in the said at least one AlTiN-based film corresponds to $d>0$, preferably $d \geq 0.001$, more preferably $d>0.001$.

Preferably said at least one AlTiN-based film exhibits internal compressive stresses in a range between 1 GPa and 6 GPa.

Preferably the said at least one AlTiN-based film exhibits a Young's modulus $E>350$ GPa.

Preferably the crystallographic cubic structure of the at least one AlTiN-based coating deposited comprises crystallite grains with coarse grain size, corresponding to an average grain size of more than 15 nm.

Preferably the said at least one AlTiN-based film exhibits a very smooth surface characterized by $Rz<1$ µm.

Preferably the said at least one AlTiN-based film shows higher elastic modulus of over 400 GPa, preferably in the area of 415 GPa, whereas the preferred hardness is—at least essentially—44 GPa.

Preferably the said AlTiN-based film is deposited on top of a cubic template layer TiN with a thickness about 50 nm.

Figure 7:
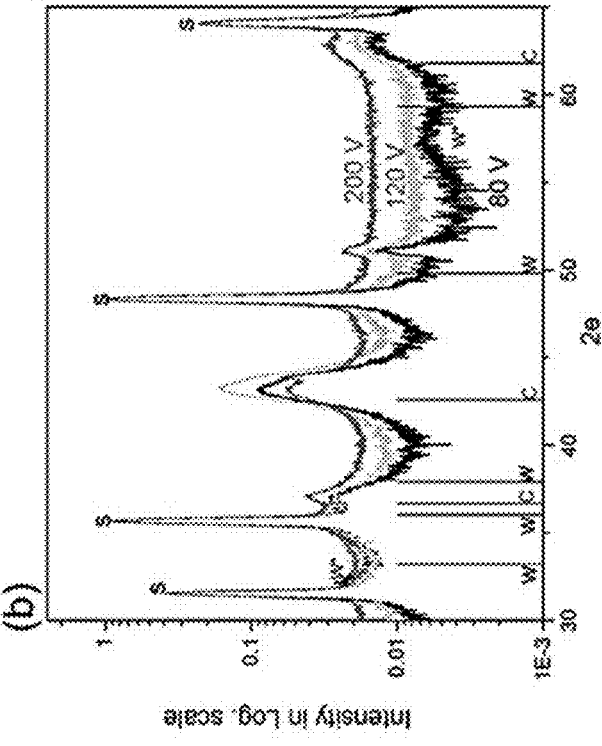
Figure 7:
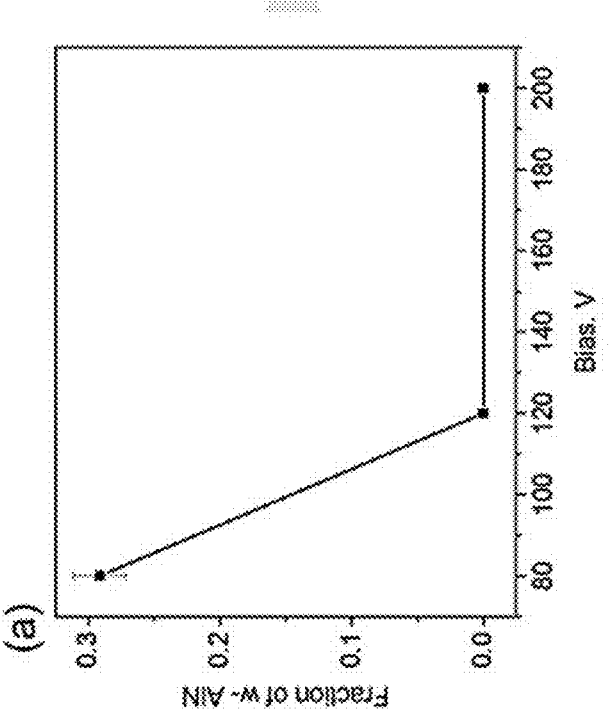
Figure 8:
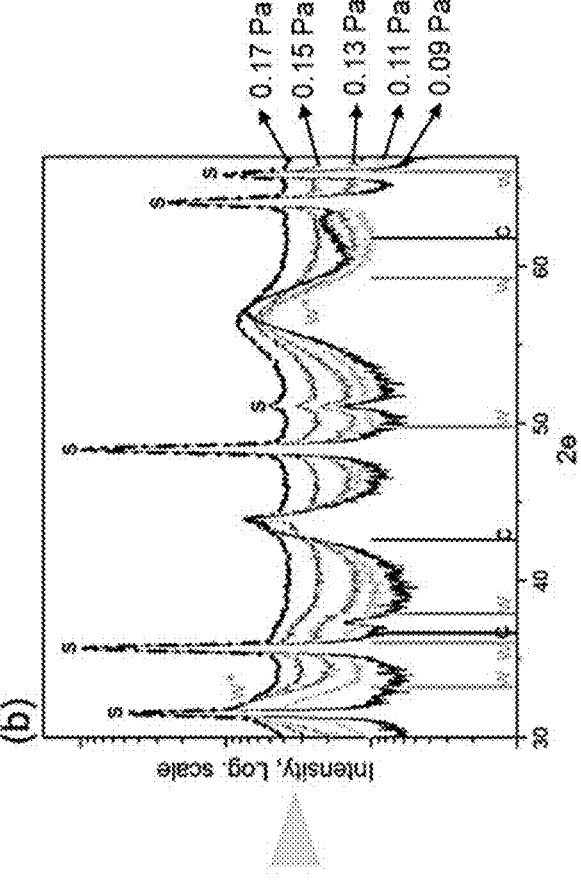
Figure 8:
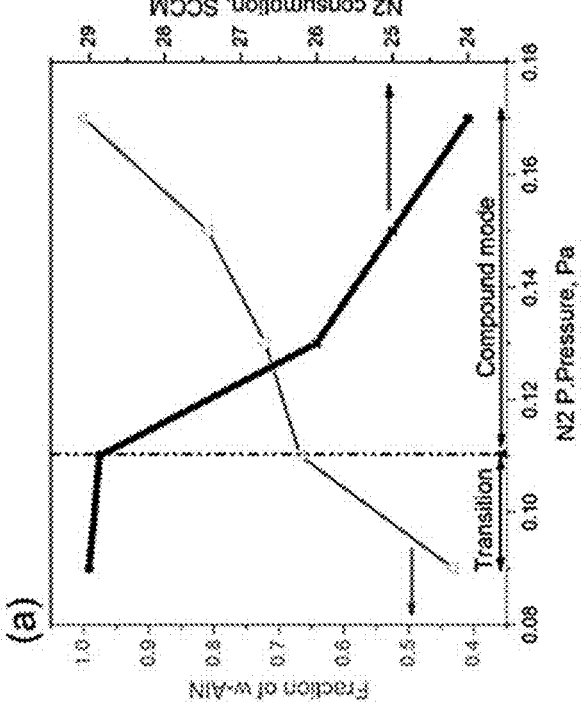
Figure 9:
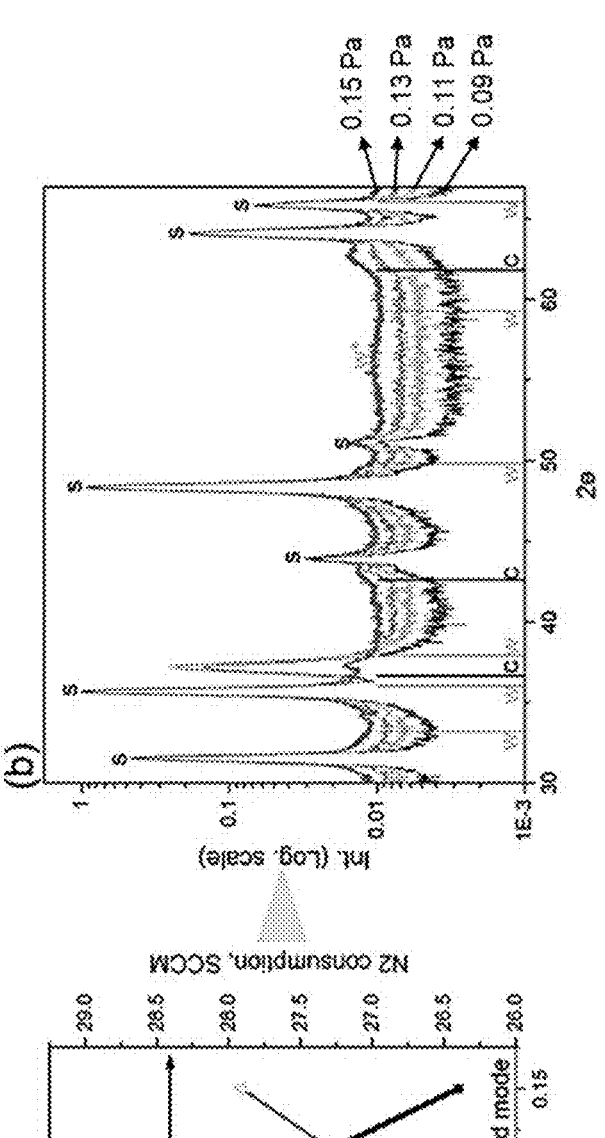
Figure 9:
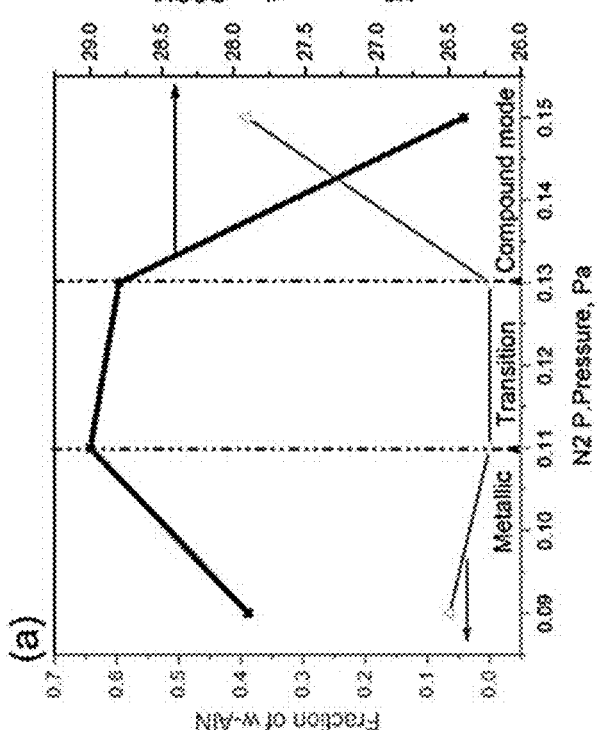

In order to explain the invention in more detail, the inventors will refer especially in the description to the results presented in FIGS. 2, 3, 4, 5 and 6 as well as further analysis shown in FIGS. 7 to 9.

FIGURES MENTIONED IN THE DESCRIPTION

FIG. 1: Graphical representation of relative phase stability, microstructural variation, and mechanical property evolution of AlTiN as a function of Al concentration. Range A: columnar structure with cubic phase; Range B: nanocomposite structure consisting of c-TiN-rich and w-AlN-rich domains; Range C: columnar structure with wurtzite phase.

Figure 2:
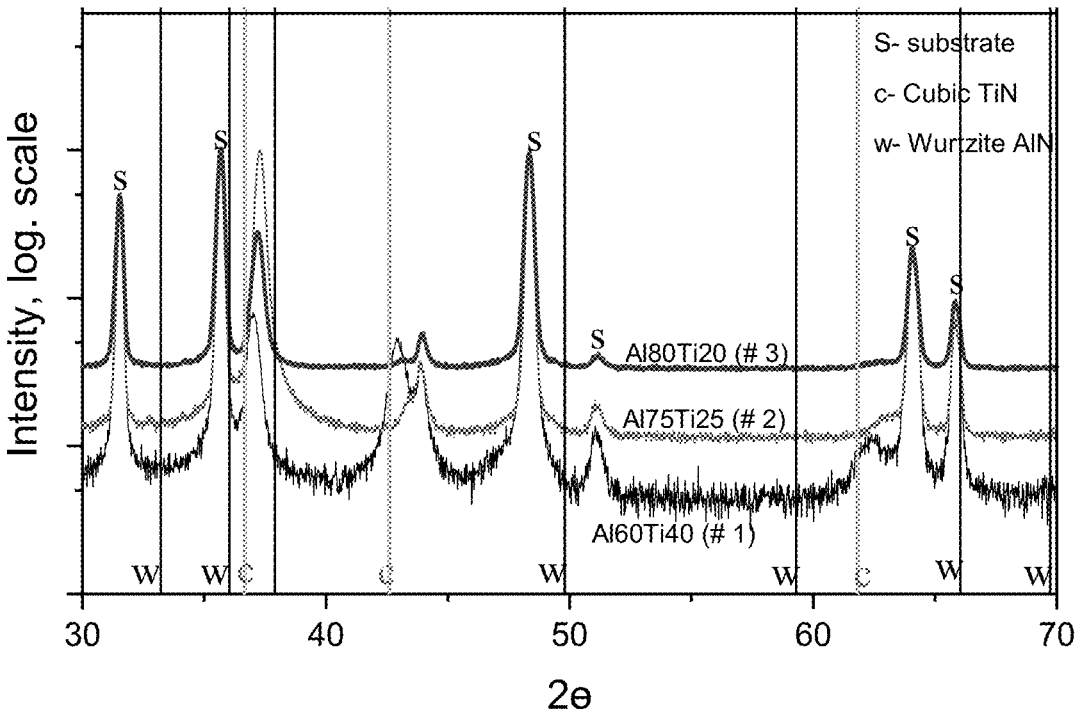

FIG. 2: X-ray Scan in Bragg-Brentano geometry of coatings deposited as AlTiN films, which were deposited consisting essentially of AlTiN (i.e. consisting essentially of aluminium titanium and nitrogen but may contain small amounts of impurities such as rests of working gas, in this case argon). The AlTiN films were deposited containing different Al concentrations (respectively: Example #1, Batch-No. #211 deposition from AlTi-targets with composition Al:Ti of 60:40 in at. % at a substrate temperature of 430° C.; Example #2, Batch-No. #1144 deposition from AlTi-targets with composition Al:Ti of 75:25 in at. % at a substrate temperature of 430° C.; Example #3, Batch-No. #290 deposition from AlTi-targets with composition Al:Ti of 80:20 in at. % at a substrate temperature of 200° C. As it can be observed in FIG. 2, no w-AlN peaks were observed by X-ray analysis of any of the above-mentioned films, even for the coatings (AlTiN films) that were synthesized from Al80Ti20 targets at a substrate temperature of 200° C.

FIG. 3: Coating composition measured by EDX. The measured element composition of the coatings corresponding to the Examples #1, #2 and #3 can be taken from the table shown in FIG. 3. The relation Al/(Al+Ti) in at. % is almost the same in the targets used as material source for coating deposition and in the deposited coatings.

Figure 4:
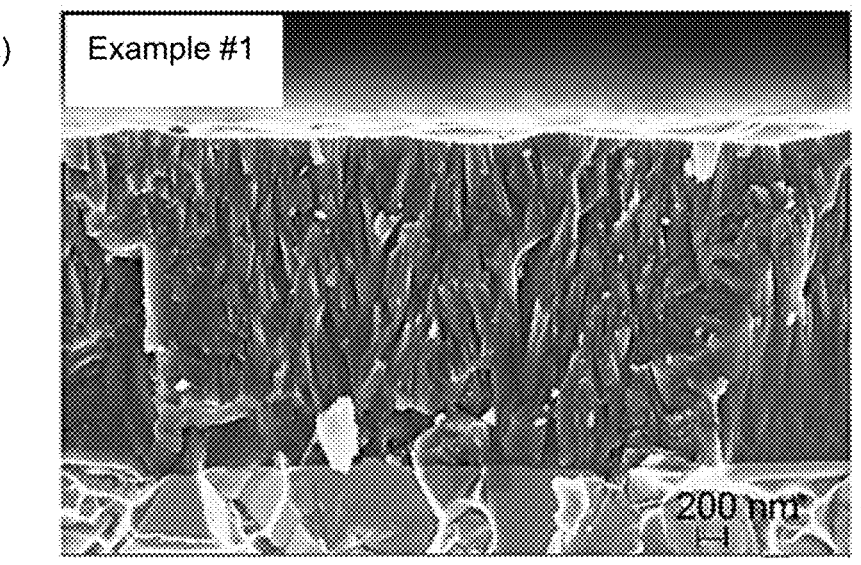
Figure 4:
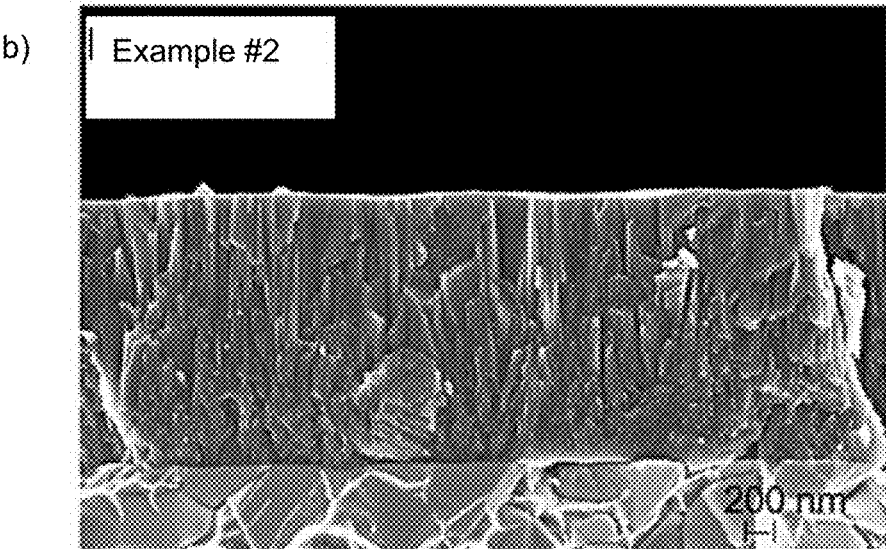
Figure 4:
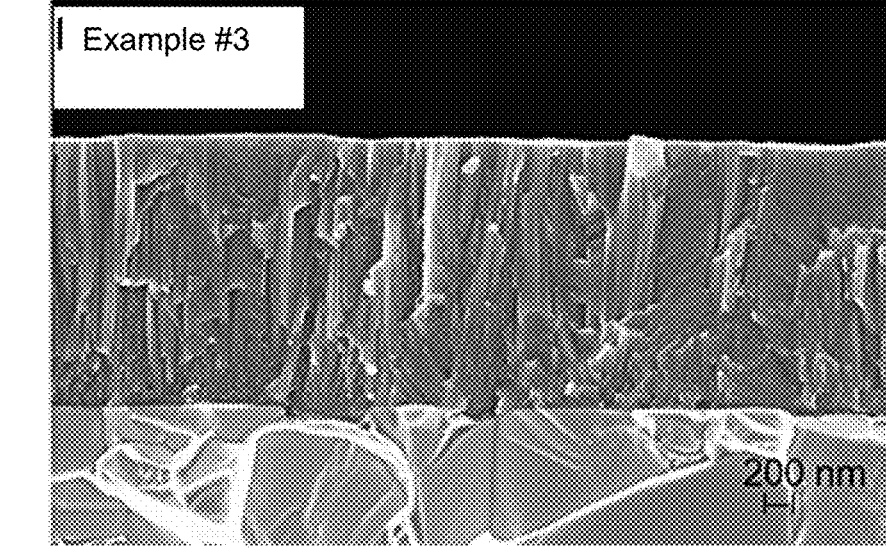

FIG. 4: Scanning electron microscopic (SEM) image of fractured coatings. The SEM images were taken for analysis of the fracture morphology of the coatings corresponding to the Examples #1, #2 and #3, as shown in pictures a), b) and c) of FIG. 4, respectively. In these pictures it is possible to observe columnar structured AlTiN coatings (columnar film growth) even when the Al content in the AlTiN film corresponds to 80 Al at. %.

Figure 5:
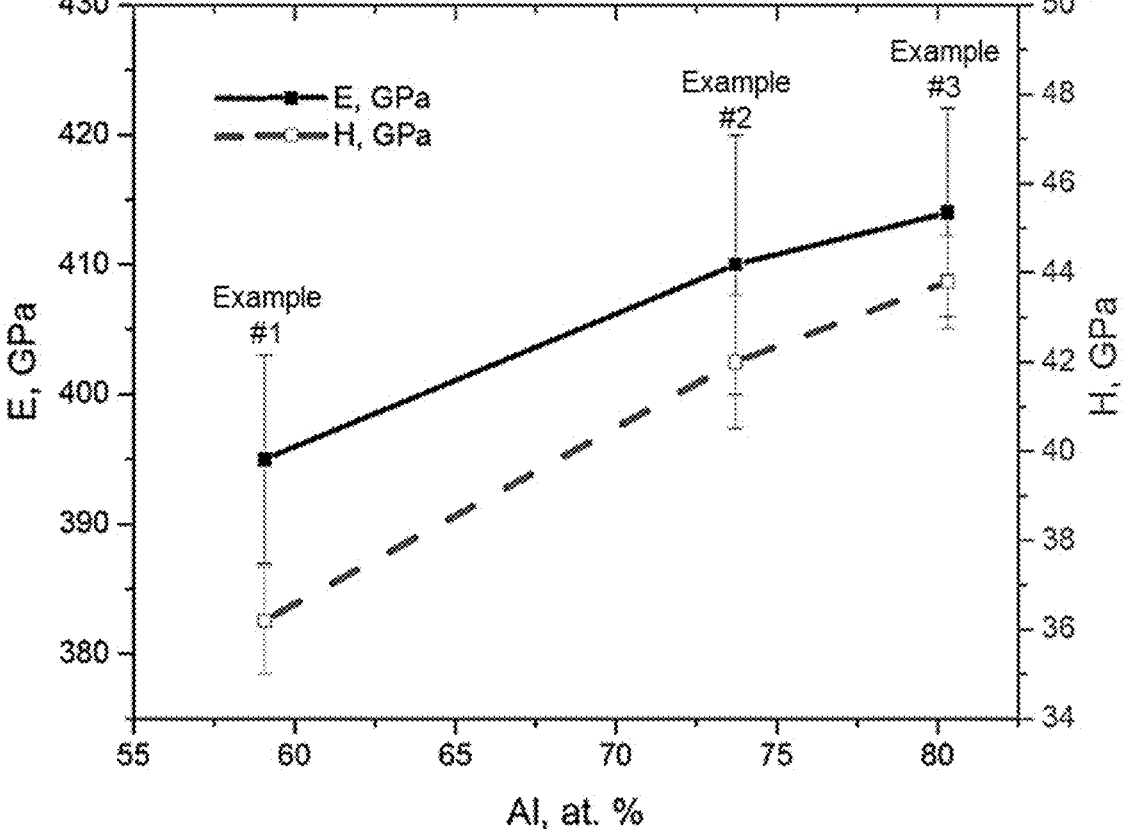

FIG. 5: Variation of Elastic modulus (E) and Hardness (H) exhibited by c-AlTiN coatings (c-AlTiN coatings are to be understood as AlTiN coating films exhibiting X-ray peaks corresponding to the cubic phase but not to the wurtzite phase) as a function of Al content in the c-AlTiN coating. An increment of the Elastic modulus as well as an increment of the Hardness was observed by increasing Al concentration in the c-AlTiN coatings deposited according to the Examples #1, #2 and #3. Remarkable are the considerable high E and H values observed even at a very high Al concentration corresponding to 80 at. %.

FIG. 6: Optical microscopic image and roughness measurement of AlTiN coatings deposited having different Al concentrations. Apart from samples coated according to the Examples #1, #2 and #3, in which coating was produced by using HiPIMS techniques, further samples coated according to an Example #4 were investigated. Samples coated according to the Example 4 were coated by using the same kind of targets used in Example 1 (i.e. Al60Ti40) but by using cathodic arc evaporation techniques instead of HiPIMS techniques. For the analysis shown in FIG. 6, samples made of WC—Co were polished to be used as substrates and were coated after polishing according to Examples #1, #2, #3 and #4, respectively, for comparing surface quality of the produced coatings.

FIG. 7: Influence of substrate bias on fraction of wurtzite phase of AlN in the AlTiN coatings (in this context also referred to as "influence of substrate bias on structural evolution of AlTiN coating films"). In FIG. 7($a$) it is shown how the fraction of w-AlN of AlTiN coating films synthesized from one or more Al80Ti20 targets changes as a function of substrate bias voltage. In FIG. 7($b$) it is shown how the X-ray spectrum of AlTiN coating film synthesized from one or more Al80Ti20 targets can change by applying different substrate bias corresponding to −80 V, −120 V, and −200 V, respectively.

The data used for producing the graphic shown in FIG. 7($a$) was extracted from corresponding X-ray spectrums of the corresponding AlTiN coating films produced from Al80Ti20 targets by applying different negative bias voltages at the substrates being coated. The fraction of w-AlN (in this context also referred to as Fr w-AlN) that is represented in FIG. 7($a$) was calculated as following:

$$Frw - AlN = \frac{\text{intensity of wurtzite phase}}{\sum (\text{intensity of cubic phase} + \text{intensity of wurtzite phase})}$$

FIG. 8: Influence of nitrogen partial pressure on fraction of wurtzite phase of AlN in the AlTiN coatings (in this context also referred to as "influence of $N_2$ partial pressure on structural evolution of AlTiN coatings films) synthesized from Al80Ti20 targets at a substrate temperature of 400° C. and argon partial pressure (Ar partial pressure) of 0.2 Pa. In FIG. 8 ($a$) a graphic with the variation of the fraction of w-AlN obtained by varying the $N_2$ consumption (a similar curve can be obtained by using coating growth rate/unit time instead of $N_2$ consumption because these parameters are directly proportional) as a function of $N_2$ partial pressure is shown. In this graphic two zones are indicated, which correspond to two different coating deposition modes that in this context will be called: transition mode and compound mode. In FIG. 8 (*b*) the X-ray diffractograms of the AlTiN coating films deposited at different $N_2$ partial pressures are shown. The $N_2$ partial pressures were 0.09, 0.11, 0.13, 0.15 and 0.17 Pa, respectively.

FIG. 9: Influence of $N_2$ partial pressure on structural evolution of AlTiN coatings films synthesized from Al80Ti20 targets at a substrate temperature of 200° C. and Ar partial pressure of 0.2 Pa. In FIG. 9 (*a*) a graphic with the variation of the fraction of w-AlN obtained by varying the $N_2$ consumption (growth rate/unit time) as a function of $N_2$ partial pressure is shown. In this graphic three zones are indicated, which correspond to three different coating deposition modes that in this context will be called: metallic mode, transition mode and compound mode. In FIG. 9 (*b*) the X-ray diffractograms of the AlTiN coating films deposited at different $N_2$ partial pressures are shown. The $N_2$ partial pressures were 0.09, 0.11, 0.13, 0.15 Pa, respectively.

Figure 10:
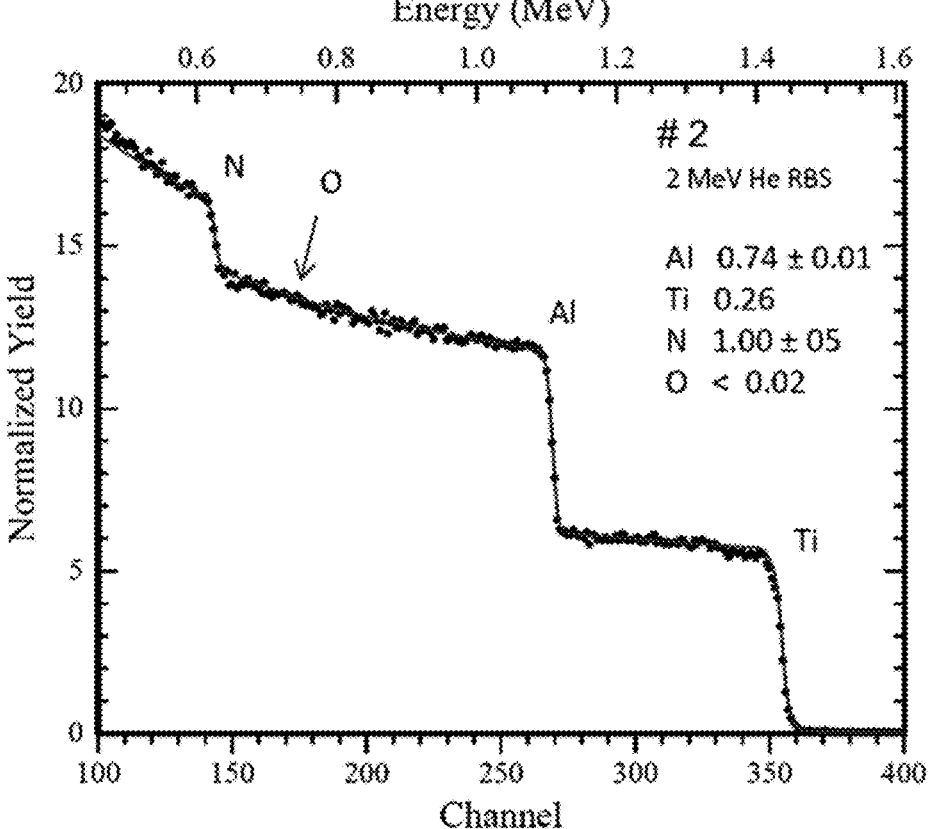

FIG. 10: Chemical analysis by using Rutherford backscattering spectrometry (RBS) of a coating synthetized according to Example #2. For the RBS analysis a 2 MeV He+ beam was used. The RBS measurements agree with the EDX measurements reported in Table shown in FIG. 3.

The AlTiN-based films produced according to the present invention comprise an Al-content in the metallic sub-lattice higher than 75 at. %, exhibit crystallographic cubic phase and internal compressive stresses.

According to an embodiment of the present invention the inventive coatings comprise at least one AlTiN-based film having chemical composition in atomic percentage corresponding to the formula $(Al_a Ti_b)(N_c Ar_d)_y$ with $0 \leq d < 0.02$, $1 \geq c > 0.98$, $a+b=1$, $c+d=1$ and $a > 0.75$ (e.g. between 0.76 and 0.95), where a, b, c and d are the atomic fraction of the concentration of aluminum, titanium, nitrogen and argon, respectively, and $0.8 \leq y \leq 1.2$.

According to a preferred variant of the above-mentioned embodiment of the present invention, the content of argon in the AlTiN-based film correspond to d>0, preferably d $0.001 \geq$, more preferably d>0.001.

In order to simply the formula of chemical composition of the coatings deposited according to the present invention, the formula can also be written without taking into account the argon content in the AlTiN-based film, so that the simplified formula is $(Al_x Ti_{1-x})N$ with x>0.75.

As already mentioned above, all AlTiN-based films according to the present invention exhibit a crystallographic cubic phase.

Furthermore, all AlTiN-based films according to the present invention are deposited exhibiting internal compressive stresses in a range between 1 GPa and 6 GPa. It means residual stresses in a range of values between −1 GPa and −6 GPa.

Preferably the AlTiN-based films according to the present invention are deposited having Young's modulus E>350 GPa.

The inventors found that the cubic phase Al-rich AlTiN-based films according to the present invention can be deposited at substrate temperatures lower than 600° C., what was not expected because actually cubic phase Al-rich AlTiN-based deposited by CVD are deposited at much higher temperatures.

Preferred embodiments of the present invention involve deposition of AlTiN-based films exhibiting Young's modulus>400 GPa, and hardness>40 GPa.

Coatings comprising AlTiN-based films according to the present invention exhibit improved wear resistance during application at both room temperature and elevated temperatures, e.g. at elevated temperatures of above 900° C.

By using PVD processes of the type High Power Impulse Magnetron Sputtering (HIPIMS), which is also called High Power Pulse Magnetron Sputtering (HPPMS) it was also possible to produce AlTiN-based films according to the present invention exhibiting a very smooth surface characterized by roughness Rz<1 μm (see Examples #1, #2 and #3 in FIG. 4. Example #5 in FIG. 4 was deposited by cathodic arc evaporation and exhibits considerably higher roughness Rz.

The inventors found that surprisingly the crystallographic cubic structure of the AlTiN-based coatings deposited according to the present invention comprised crystallite grains with relatively coarse grain size, corresponding to an average grain size of more than 15 nm.

c-AlTiN (cubic phase AlTiN) is a metastable solid solution, whose mechanical and functional properties are dependent on Al concentration. Mechanical properties like room temperature hardness caused by solid solution, and modulus strengthening, age hardening response caused by iso-structural decomposition of metastable c-AlTiN in to c-TiN-rich and c-AlN-rich domains, and functional properties like oxidation resistance of c-AlTiN increases with Al concentration.

The above discussion summarizes that to enhance the wear resistance of c-AlTiN coatings, it is desirable to form Al-rich c-AlTiN, preferably with an Al concentration about 80 at. %. However, the current achievable solubility limit of Al in c-AlTiN is about 67 at. % by PVD methods. Several attempts were made to push this level further, but not success full by PVD methods.

Very recently known CVD methods that are used for producing grow of Al-rich c-AlTiN with 80 at. % Al have the disadvantage that the coatings produced do not exhibit internal compressive stresses, which are actually very positive in many applications. CVD produced Al-rich c-AlTiN containing 80 at. % seems to allow an important increment of tool life of coated cutting tools in comparison with cutting tools coated with PVD c-AlTiN coatings containing 67 at. % Al. The higher performance in the former case has been attributed to the fact of stabilizing AlTiN in cubic phase at higher Al concentrations of 80 at. %. However, the CVD process consists of toxic gases such as TiCl4, AlCl3 and NH3, and a high substrate temperature of 700 C. Combination of these factors severely restrict the choice of substrate materials that can be deposited with Al-rich c-AlTiN coating there by the application range of Al-rich AlTiN wear resistant coatings synthesized by CVD. Additionally, hazardous precursors have to be used for depositions which makes production under industrial conditions.

Because of the above explained reasons regarding CVD produced Al-rich c-AlTiN coatings, the coatings according to the present invention corresponding to PVD produced Al-rich c-AlTiN coatings with Al concentrations of more than 75 at. %, in relation to the Ti concentrations are especially advantageous.

The present invention discloses concretely the growth of the desired coating comprising at least one c-AlTiN film with an Al concentration higher than 75 at. % Al in Within the scope of the present invention it was possible to develop:

A PVD method for synthesizing Al-rich AlTiN-based film (Al content higher than 75 at. %, when Al content+Ti content=100 at. %), which allows producing AlTiN coatings in a cubic phase with elastic modulus>350 GPa and Ar content in the range mentioned above. The produced c-AlTiN coatings with cubic crystal structure were producing having Al concentration x>0.75 (if taking the simplified chemical composition formula into account: (Al$_x$Ti$_{1-x}$)N, in particular with x=0.80. The PVD method used for producing the (Al$_x$Ti$_{1-x}$)N coatings according to the present invention allows growth of these kind of coatings at a substrate temperature lower than 600° C., in particular a substrate temperature of 200° C. (see FIGS. 2, 3 and 4).

In FIG. 5 experimental results related to the mechanical properties of the inventive Al-rich c-AlTiN coatings with Young's modulus of above 380 GPa and with Al concentration of about 80 at. %, synthetized by PVD methods, in particular by HiPIMS are shown and compared with coatings comprising lower Al content. These c-AlTiN coatings exhibit hardness of above 40 GPa as it is also shown in FIG. 5.

In FIG. 4 it is shown the fracture cross section of the inventive coatings with a relatively coarse grain size of >15 nm and columnar structure corresponding to the c-AlTiN coatings produced according to the present invention, having Al concentration of about 80 at. % (taking only in consideration Al content and Ti content).

The Al-rich c-AlTiN with the above mentioned composition, deposited by HiPIMS exhibit at the same a smooth surface finish of Rz<1 μm.

The combination of above-mentioned composition-structure-property results in enhanced wear resistance, for example in cutting applications.

AlN—TiN is an immiscible system with a positive enthalpy of mixing about 0.15 eV/atom. In spite being an immiscible system, it was demonstrated by the present invention that it is possible to achieve a metastable cubic solid solution of Al-rich c-AlTiN.

The inventors are of the opinion that it can be associated with kinetically limited process conditions prevailing on the growth front of a PVD process, e.g.: a high quench rate (~10^11 k/sec) of incident hyper energy particles with a cumulative potential and kinetic energy in the range between 40 and 100 eV/atom.

The quench rate, and the incoming ad-atom energy can be adjusted by selecting several process levers such as:

a) at target: power density and average power to vary the ionization degree of incident species and the coating growth rate independently. In case of pulsed power supply, pulse parameters like pulse length, and pulse frequency to alter the target poisoning behaviour (more importantly for sputtering process) and the evaporation rate independently.

b) at substrate: Bias voltage to alter the kinetic energy of incident species, substrate temperature to influence the ad-atom mobility on the growth front of film growth, and other process levers include total gas pressure to cause thermalization and there by the average charge state and the potential energy of the incident species. More importantly, the partial pressure of the reactive gas that controls the degree of target poisoning in case of a reactive sputtering process.

By optimizing different process levers, the metastable solubility of Al in the c-AlTiN can be pushed to higher concentration. As of today, the highest ever reported metastable solubility limit of Al content (taking into consideration only Al and Ti content) is 67 at. % by arc deposition and 62 at. % by sputtering. Prior studies present several attempts, which were made to enhance the metastable solubility limit, but a c-AlTiN with Al concentration above 70 at. % was never reported before by any PVD process.

Only by means of the present invention, it was possible. The current invention discloses c-AlTiN coating with more than 75 at. % (e.g. 80 at. %), which were produced by grown under specific growth conditions using a HiPIMS method and by maintained a low substrate temperature during coating process.

The HiPIMS technology that was used allows power regulated pulsed sputtering processes, characterized by high power density up to 3 kW/cm2. The processes are highly flexible since the peak power, average power, and pulse length can be varied independently. For the production of the coatings according to the present invention also long pulses were used. The used technology has allowed the use of pulse lengths of up to 100 ms, even at a high power density of up to 3 kW/cm2.

Within the scope of the present invention, the inventors have investigated the influence of previously mentioned process levers on the phase stability of c-AlTiN via altering the thermodynamic and kinetic conditions at the growth front. By scanning different process levers, surprisingly a process window was discovered to extend the metastable solubility of Al in c-AlTiN up to 80 at. % that is not available previously. The important process levers are described below, and the results are for example presented in FIGS. 7, 8 and 9. It can be observed that when any of the below parameters are deviated from the specific optimal levels, the cubic phase stability of Al-rich c-AlTiN is severely hampered.

Preferred coating parameters for producing the coatings according to the present invention:

1) A substrate bias preferably higher than 40 V but lower than 200 V. See the effect of the substrate bias on the structural evolution of AlTiN coatings in FIG. 7.

2) N$_2$ partial pressure must be right enough to be in the transition mode of sputtering. See the effect sputtering mode of target operation on cubic phase stability in FIGS. 8 and 9.

3) Substrate temperature must be sufficiently low enough to freeze (to sufficiently reduce) the ad-atom mobility. See the combined effect of substrate temp. and N$_2$ partial pressure on cubic phase stability of AlTiN.

4) A cubic template layer TiN with a thickness about 50 nm to cause nucleation of cubic phase in AlTiN in spite of higher Al concentration.

In summary, the current invention shows how to achieve Al-rich c-AlTiN containing x>0.75 (more than 75% in atomic percentage, when Al content+Ti content is considered 100 at.-%), under specific growth conditions. As shown in the above-mentioned figures, it was possible to synthesize Al-rich c-AlTiN coating shows higher Elastic modulus of ~415 GPa, Hardness of 44 GPa, and likely a higher oxidation resistance due to higher Al concentration.

In spite of the examples showed in the present description, which involves the use of HiPIMS technology for producing the inventive coatings, the inventors are of the opinion that a person skilled in the art can use the knowledge described in the present invention and the disclosed process parameters window as well as mentioned conditions for using also other kind of PVD processes, e.g.: arc deposition and related hybrid processes in order to produce the inventive coatings.

Monolithic and multi-layered AlTiN coatings are well known for their wear protection in cutting, forming and related applications. Retaining the solid solution in cubic phase at higher Al concentrations is the key for enhanced wear resistance.

The inventors disclose in the present invention for the first time, a PVD method for forming Al-rich c-AlTiN films with a high Al concentration of more than 75 at. %, and preferably of 80 at % or above 80 at. %.

The coatings shown in some of the figures included in this description of the invention, exhibit a columnar structure with an elastic modulus of 420 GPa, and hardness of 42 GPa even at a higher Al concentration of 80 at. % which were before not possible and not known from prior art by using PVD methods.

The inventive PVD Al-rich AlTiN coatings that are disclosed in the present description of the invention are expected to outperform the state of the art PVD AlTiN coatings in tribological applications by the fact that cubic phase is retained at higher Al concentrations. The inventive Al-rich AlTiN coatings are expected to exhibit a superior oxidation resistance and improved mechanical properties compared to the prior art c-AlTiN coatings with Al content of 67 at. % or lower.

By varying or selecting a specific bias voltage value is possible to produce inventive Al-rich c-AlTiN films having preferred (111) texture, or (200) texture or a mixture thereof.

The inventors consider also that coatings for different applications can include at least one AlTiN-film produced according to the present invention combined with at least one layer of other kind of material, e.g. AlCrN, TiSiN, or others depending on the application.

Present invention involves coating deposition of coatings having a multilayer structure, wherein the multilayer structure comprises at least one layer that is an inventive AlTiN coating film deposited according to any of the embodiments of the present invention, e.g. the inventive coating film can be an $Al_{0.8}Ti_{0.2}N$ film exhibiting only cubic phase and compressive stress.

The AlTiN-based film according to the present invention can also comprise additional elements such as Cr, Ta, or others in a proportion lower than 1 at % (when only the alloyed element, Al and Ti are taken into account). One possibility would be by using AlTi-targets including these alloyed elements. In particular, additional elements like Cr and Ta, can help to stabilize the cubic phase or to improve coating properties.

Evolution of flank wear as a function of tool life for different variants of AlTiN coatings in a wet milling test was investigated. The results that were considered for the analysis correspond to averaged values from two tests. Solid carbide end mill tools with d=10 mm were coated with coatings having total coating thickness of around 3 μm (for all coatings tested). SUS316L stainless steel was used as a work piece material. Cutting parameters used were: Cutting speed (Vc): 110 m/min, axial depth of cut (ap): 8 mm, engagement (ae): 3.9 mm. Cutting tests confirm improved tool life attained by the AlTiN coatings synthesized according to the present invention in comparison with both coatings exhibiting same Al content but mixture of cubic phase and wurtzite phase instead of only cubic phase and coatings exhibiting only cubic phase but lower Al content. The improvement in tool life in meters was of more than 50%.

The inventive examples mentioned in the present description should be considered show cases and preferred embodiments of the invention but in not any case, as limitation of the present invention.

For the coatings described in the present description, which were deposited by using HiPIMS, a sputter power density (Power pulse peak/Race track size) between 1 and 2 kW/cm² and a pulse duration between 5 and 50 ms was used. This parameters should be considered as example but not as a limitation of the method according to the present invention.

Coatings deposited according to Example 3 as well as the method used for deposition of the coating according to Example 3 can be considered as one show case of the present invention. In this inventive Example Al80Ti20 targets were sputtered by using HiPIMS in an atmosphere comprising argon at a Ar partial pressure of 0.2 Pa and also comprising nitrogen as reactive gas at a $N_2$ partial pressure of 0.11 Pa. The substrate temperature was maintained at 200° C.

FURTHER DETAILS AND EXPLANATIONS

Example 1: coatings were deposited by using Al60Ti40 targets by using HiPIMS with sputtering in transition mode, bias voltage of –120 V, Ar partial pressure of 0.6, $N_2$ partial pressure of 0.43 and substrate temperature of 430° C.

Example 2: coatings were deposited by using Al75Ti25 targets by using HiPIMS with sputtering in transition mode, bias voltage of –120 V, Ar partial pressure of 0.2, $N_2$ partial pressure of 0.11 and substrate temperature of 430° C.

(Inventive) Example 3: coatings were deposited by using Al80Ti20 targets by using HiPIMS with sputtering in transition mode, bias voltage of –120 V, Ar partial pressure of 0.2, $N_2$ partial pressure of 0.13 and substrate temperature of 200° C.

For results related to coatings presented in FIG. 8 the used substrate temperature and bias voltage was 400° C. and 120 V, respectively.

For results related to coatings presented in FIG. 9 the used substrate temperature and bias voltage was 200° C. and 120 V, respectively.

As it is shown in FIGS. 8 and 9 the transition mode corresponds to a mode of sputtering at which the pressure range corresponds to the transition between metallic mode to compound mode. In the context of the present invention, this range begins when the maximal consumption is attained and ends when a pronounced fall of $N_2$ consumption is attained. As it can be observed in FIGS. 8 and 9, more in particular in FIG. 9, during transition mode the $N_2$ consumption is plotted describing a "local plateau" in the curve of N2 consumption vs $N_2$ partial pressure.

Hardness, and Elastic modulus of coatings were measured by using the nanoindentation following the ISO 14577.

In metallic mode, the target surface is dominantly kept in the metallic state. As a result, the $N_2$ consumption increases as a function of $N_2$ Partial pressure.

In compound mode: The partial pressure of $N_2$ gas is high enough to form nitrides of AlN, and TiN on the target surface. As a result, the sputtering of the target reduces, thereby a drop in $N_2$ consumption.

PREFERRED EMBODIMENTS OF THE INVENTION

PVD process for deposition of an AlTiN-based film
comprising an Al-content which is—in relation to the Ti-content—in atomic percentage higher than 75% and preferably higher than 80%
and exhibiting only a crystallographic cubic phase and internal compressive stresses, wherein
the PVD process is a sputtering process, preferably a High Power Pulse Magnetron Sputtering "HiPIMS" in which at least the coating parameters
substrate bias,
substrate temperature
and $N_2$ partial pressure
are selected so that
the mobility of the atoms being involved in the formation of the AlTiN-based film at the substrate surface is reduced and so that the metastable solubility of Al in the crystal-lographic cubic phase of the AlTiN-based film being formed is increased which causes the deposition of said AlTiN-based film.

PVD process according to above mentioned embodiment, wherein the coating parameter "substrate bias" is selected so that it is higher than 40 V but lower than 200 V.

PVD process according to any of the two above mentioned embodiments, wherein the coating parameter "substrate temperature" is selected so that it is low enough to freeze the ad-atom mobility preferably lower than 600° C., more preferably at or lower than 300° C. and ideally at a substrate temperature between 200° C. and 250° C.

PVD process according to one of three above mentioned embodiments, wherein the coating parameter "N2 partial pressure" is selected so that the sputtering takes place in transition mode [page 8, last paragraph] whereas the N2 partial pressure is preferably in the range between 0.1 Pa and 0.14 Pa and more preferably in the range between 0.11 Pa and 0.13 Pa.

PVD process according to one of the four preceding embodiments, wherein the coating parameter "power density" of the HiPIMS PVD process is selected so, that the HiPIMS PVD process is operated with a high power density up to 3 kW/cm2.

PVD process according to one of the five preceding embodiments, wherein the quench rate, which is preferably in the range of 10^11 k/sec, and the incoming ad-atom energy are adjusted as required for deposition of an AlTiN-based film comprising an Al-content which is—in relation to the Ti-content—in atomic percentage higher than 75% and preferably higher than 80% by means of adjusting the following process parameters accordingly:

a) power density and average power to vary the ionization degree of incident species and the coating growth rate independently.

b) pulse parameters like pulse length, and pulse frequency c) bias voltage to alter the kinetic energy of incident species, d) substrate temperature to influence the ad-atom mobility on the growth front of film growth, e) and the partial pressure of the reactive gas that controls the degree of target poisoning in case of a reactive sputtering process.

PVD process according to one of the six preceding embodiments, wherein by varying or selecting a specific bias voltage value a preferred (111) texture, or (200) a texture or a mixture thereof is produced.

Coating comprising at least one AlTiN-based film deposited by means of a PVD process, wherein the at least one AlTiN-based film deposited is comprising an Al-content—in relation to the Ti-content—in atomic percentage higher than 75%, and wherein the AlTiN-based film exhibits a crystallographic cubic phase and internal compressive stresses.

Coating according to the directly above-mentioned embodiment of an inventive coating, wherein said at least one AlTiN-based film has a chemical composition in atomic percentage corresponding to the formula $(Al_aTi_b)(N_cAr_d)_y$ with $0 \leq d < 0.02$, $1 \geq c > 0.98$, $a+b=1$, $c+d=1$ and $a > 0.75$, where a, b, c and d are the atomic fraction of the concentration of aluminum, titanium, nitrogen and argon, respectively, and $0.8 \leq y \leq 1.2$.

Coating according to any of the two above mentioned inventive coatings (embodiments), wherein the content of argon in the said at least one AlTiN-based film corresponds to $d > 0$, preferably $d \geq 0.001$, more preferably $d > 0.001$.

Coating according to one of the three preceding embodiments, wherein said at least one AlTiN-based film exhibits internal compressive stresses in a range between 1 GPa and 6 GPa.

Coating according to one of four preceding embodiments, wherein the said at least one AlTiN-based film exhibits a Young's modulus E>350 GPa.

Coating according to one of five preceding embodiments, wherein the crystallographic cubic structure of the at least one AlTiN-based coating deposited comprises crystallite grains with coarse grain size, corresponding to an average grain size of more than 15 nm.

Coating according to one of the six preceding embodiments, wherein the said at least one AlTiN-based film exhibits a very smooth surface characterized by Rz<1 μm.

Coating according to one of the preceding seven embodiments, wherein the said at least one AlTiN-based film shows higher elastic modulus of over 400 GPa, preferably in the area of 415 GPa, whereas the preferred hardness is—at least essentially—44 GPa.

Coating according to one of eight preceding embodiments, wherein the said the said AlTiN-based film is deposited on top of a cubic template layer TiN with a thickness about 50 nm.

The invention claimed is:

1. A coating comprising at least one AlTiN-based film deposited using a PVD process, wherein the at least one AlTiN-based film deposited comprises an Al-content—in relation to a Ti-content—in atomic percentage 76% or higher, and wherein the AlTiN-based film exhibits solely a crystallographic cubic phase and internal compressive stresses, wherein said at least one AlTiN-based film has a chemical composition in atomic percentage corresponding to the formula $(Al_aTi_b)(N_cAr_d)_y$ with $0 < d < 0.02$, $1 \geq c > 0.98$, $a+b=1$, $c+d=1$ and $a > 0.75$, where a, b, c and d are an atomic fraction of a concentration of aluminum, titanium, nitrogen and argon, respectively, and $0.8 \leq y \leq 1.2$, the content of argon in the at least one AlTiN-based film corresponds to $d > 0$, said at least one AlTiN-based film exhibits internal compressive stresses in a range between 1 GPa and 6 GPa, and said at least one AlTiN-based film shows higher elastic modulus of over 400 GPa, and a hardness is—at least essentially—44 GPa.

2. The coating according to claim 1, wherein the at least one AlTiN-based film exhibits a Young's modulus E>350 GPa.

3. The coating according to claim 1, wherein the crystallographic cubic structure of the at least one AlTiN-based coating deposited comprises crystallite grains with coarse grain size, corresponding to an average grain size of more than 15 nm.

4. The coating according to claim 1, wherein the at least one AlTiN-based film exhibits a very smooth surface characterized by Rz<1 μm.

5. The coating according to claim 1, wherein the AlTiN-based film is deposited on top of a cubic template layer TiN with a thickness about 50 nm.

* * * * *